United States Patent
Suzuki et al.

(10) Patent No.: US 8,466,498 B2
(45) Date of Patent: Jun. 18, 2013

(54) SOLID STATE IMAGE DEVICE HAVING A PAIR OF OVERFLOW DRAINS EXTENDS ALONG THE ELECTRON TRANSFER DIRECTION AT A BOUNDARY BETWEEN CHANNEL REGION AND CHANNEL STOP ISOLATION REGIONS OF THE MULTIPLICATION REGISTER

(75) Inventors: Hisanori Suzuki, Hamamatsu (JP);
Yasuhito Yoneta, Hamamatsu (JP);
Shin-ichiro Takagi, Hamamatsu (JP);
Kentaro Maeta, Hamamatsu (JP);
Masaharu Muramatsu, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 265 days.

(21) Appl. No.: 12/920,119

(22) PCT Filed: Jan. 27, 2010

(86) PCT No.: PCT/JP2010/051037
§ 371 (c)(1),
(2), (4) Date: Oct. 20, 2010

(87) PCT Pub. No.: WO2010/087366
PCT Pub. Date: Aug. 5, 2010

(65) Prior Publication Data
US 2011/0186913 A1    Aug. 4, 2011

(30) Foreign Application Priority Data

Jan. 30, 2009  (JP) ................ P2009-020924

(51) Int. Cl.
*H01L 27/148* (2006.01)
*H01L 29/765* (2006.01)

(52) U.S. Cl.
USPC ...... 257/223; 257/230; 257/243; 257/E27.15; 257/E27.162

(58) Field of Classification Search
USPC ............ 257/223, 230, 243, E27.15, E27.162
See application file for complete search history.

(56) References Cited

U.S. PATENT DOCUMENTS 4,559,550 A * 12/1985 Koike et al. ................... 257/233
4,679,212 A *  7/1987 Hynecek ......................... 377/58

(Continued)

FOREIGN PATENT DOCUMENTS

EP          1 152 469        11/2001

(Continued)

*Primary Examiner* — Anh Mai
(74) *Attorney, Agent, or Firm* — Drinker Biddle & Reath LLP

(57) ABSTRACT

In a solid state imaging device with an electron multiplying function, in a section normal to an electron transfer direction of a multiplication register EM, an insulating layer 2 is thicker at both side portions than in a central region. A pair of overflow drains 1N is formed at a boundary between a central region and both side portions of an N-type semiconductor region 1C. Each overflow drain 1N extends along the electron transfer direction of the multiplication register EM. Overflow gate electrodes G extend from the thin portion to the thick portion of the insulating layer 2. The overflow gate electrodes G are disposed between both ends of each transfer electrode 8 in a longitudinal direction and the insulating layer 2, and they also function as shield electrodes for each electrode 8 (8A and 8B).

4 Claims, 13 Drawing Sheets

U.S. PATENT DOCUMENTS

| | | | |
|---|---|---|---|
| 4,698,656 A * | 10/1987 | Kamata | 257/239 |
| 5,103,278 A * | 4/1992 | Miwada | 257/239 |
| 5,337,340 A | 8/1994 | Hynecek | |
| 6,278,142 B1 | 8/2001 | Hynecek | |
| 6,278,487 B1 | 8/2001 | Nakashiba | |
| 6,444,968 B1 | 9/2002 | Burt et al. | |
| 6,693,671 B1 * | 2/2004 | Stevens et al. | 348/314 |
| 6,862,333 B2 | 3/2005 | Kashima et al. | |
| 7,190,400 B2 | 3/2007 | Hynecek | |
| 7,291,821 B2 | 11/2007 | Robbins | |
| 7,420,605 B2 | 9/2008 | Pool et al. | |
| 8,294,802 B2 * | 10/2012 | Wang et al. | 348/314 |
| 2002/0149078 A1 * | 10/2002 | Hynecek | 257/461 |
| 2002/0191093 A1 | 12/2002 | Hynecek | |
| 2003/0042510 A1 * | 3/2003 | Banghart et al. | 257/223 |
| 2004/0095491 A1 | 5/2004 | Okada | |
| 2005/0029553 A1 | 2/2005 | Hynecek | |
| 2007/0146521 A1 | 6/2007 | Robbins | |
| 2008/0137801 A1 | 6/2008 | Hadfield | |
| 2009/0020788 A1 * | 1/2009 | Meisenzahl | 257/223 |
| 2011/0024606 A1 * | 2/2011 | Suzuki et al. | 250/208.1 |

FOREIGN PATENT DOCUMENTS

| | | |
|---|---|---|
| JP | 3-252163 | 11/1991 |
| JP | 5-335549 | 12/1993 |
| JP | 2002-325720 | 11/2002 |
| JP | 2003-051510 | 2/2003 |
| JP | 2003-086782 | 3/2003 |
| JP | 2007-533130 | 11/2007 |

* cited by examiner

SOLID STATE IMAGE DEVICE HAVING A PAIR OF OVERFLOW DRAINS EXTENDS ALONG THE ELECTRON TRANSFER DIRECTION AT A BOUNDARY BETWEEN CHANNEL REGION AND CHANNEL STOP ISOLATION REGIONS OF THE MULTIPLICATION REGISTER

TECHNICAL FIELD

The present invention relates to a solid state imaging device with an electron multiplying function.

BACKGROUND ART

Solid state imaging devices that include multiplication registers are known in the art (for example, see Patent Document 1). In such solid state imaging devices, an electric charge read out from an imaging region is transferred to a multiplication register via a horizontal shift register. The multiplication register typically includes an insulating layer formed on a semiconductor layer, and a transfer electrode formed on the insulating layer. In the multiplication register, in a state that a certain electrode (DC electrode) is fixed by applying a direct current to it, when an electric potential of a next-stage transfer electrode (multiplication electrode) is greatly increased, electron multiplication takes place when an electric charge is transferred between these electrodes. In the multiplication register described in Patent Document 1 mentioned below, in order to suppress a spurious electric charge generated by multiplication electrodes in the vicinity of isolations on both sides of a channel, shield electrodes are placed between the isolations and the multiplication electrodes.

CITATION LIST

Patent Literature

Patent Document 1: Published Japanese Translation of PCT International Publication for Patent Application No. 2007-533130.

SUMMARY OF INVENTION

Technical Problem

However, in a configuration described above, removal of the spurious electric charge below the multiplication electrodes is insufficient so that noise is created in image signals.

The present invention is made in view of the above problems and it is an object of the present invention to provide a solid state imaging device with an electron multiplying function that can sufficiently suppress noise.

Solution to Problem

In order to solve the above problems a solid state imaging device with an electron multiplying function according to an aspect of the present invention includes an imaging region; a horizontal shift register that transfers electrons from the imaging region; and a multiplication register that multiplies the electrons from the horizontal shift register. The multiplication register includes a semiconductor region, an insulating layer formed on the semiconductor region, a plurality of transfer electrodes formed adjacent to each other on the insulating layer; and DC electrodes that are arranged between the transfer electrodes and to which a direct-current electric potential is applied. In a section normal to an electron transfer direction of the multiplication register, the insulating layer is thicker at both side portions than in a central region, and a pair of overflow drains is formed at a boundary between the central region and both the side portions of the semiconductor region. Each of the overflow drains extends along the electron transfer direction of the multiplication register.

In the multiplication register, electrons from a semiconductor region right below the DC electrode are pulled in this semiconductor region that is right below by applying a large voltage to a particular transfer electrode (multiplication electrode). Moreover, the insulating layer is thick at both side portions of electron transition. Such an insulating layer (local oxidizing film (LOCOS)) is useful in controlling an electron transmission region and an impurity addition region. On the other hand, it was found that due to an electric field generated by the multiplication electrodes to which a high voltage is applied, a spurious electric charge is generated at the boundary (bird's beak) between a place where the insulating layer is thick (both side portions) and a place where the insulating layer is thin (central region), or inside the semiconductor regions right below the insulating layer outside the boundary.

To solve this issue, in the present invention, the pair of the overflow drains is formed at the boundary between the central region and both the side portions of the semiconductor region, and each of the overflow drains is made to extend along the electron transfer direction of the multiplication register. In this configuration, because a generated spurious electric charge is absorbed by the overflow drains, electron multiplication with less noise can be performed.

Moreover, in the solid state imaging device with an electron multiplying function according to another aspect of the present invention, the transfer electrodes positioned at a next stage of the DC electrodes are taken as multiplication electrodes, and overflow gate electrodes insulated from the multiplication electrodes and the overflow drains and disposed between the multiplication electrodes and the overflow drains are further provided. Because excess electrons inside the multiplication register cause a phenomenon similar to blooming, producing noise, the excess electrons are undesirable.

To solve this issue, in the present invention, by controlling the bias potential applied to the overflow gate electrodes, the excess electrons present inside the multiplication register can be directed into the overflow drains. Moreover, it is possible to suppress an influx of the noise charge, which is generated in the regions right below the thick portions of the insulating layer positioned outside the overflow drains, to the electron transition region of the multiplication register. Due to this, electron multiplication with less noise can be performed.

Of course, by forming an appropriate potential barrier in the semiconductor region in place of the overflow gate electrodes, excess electrons that have crossed the potential barrier regions can be made to flow in the overflow drains.

That is, in the solid state imaging device with an electron multiplying function according to the present invention, potential barrier regions can be disposed between the overflow drains and the semiconductor regions to obstruct an influx of the electrons from the semiconductor regions to the overflow drains. In this structure, even if the overflow gates are not formed, excess electrons that have crossed the potential barrier regions can be made to flow from the electron transition region to the overflow drains. Due to this, electron multiplication with less noise can be performed. Moreover, the potential bather regions can suppress an influx of the noise charge, which is generated in the regions right below the thick portions of the insulating layer positioned outside the overflow drains, to the electron transition region of the multiplication register.

Moreover, it is preferable that the semiconductor region is made comprised of an N-type semiconductor, the potential barrier regions are comprised of an N-type semiconductor having an impurity concentration lower than the semiconductor region, and the overflow drains are comprised of an N-type semiconductor having an impurity concentration higher than the semiconductor region. Because the lower impurity concentration N-type semiconductor functions as the potential barrier, electron multiplication with less noise can be performed.

Advantageous Effects of Invention

A solid state imaging device with an electron multiplying function according to the present invention is advantageous in that it enables an electron multiplication with less noise.

DESCRIPTION OF EMBODIMENTS

Figure 1:
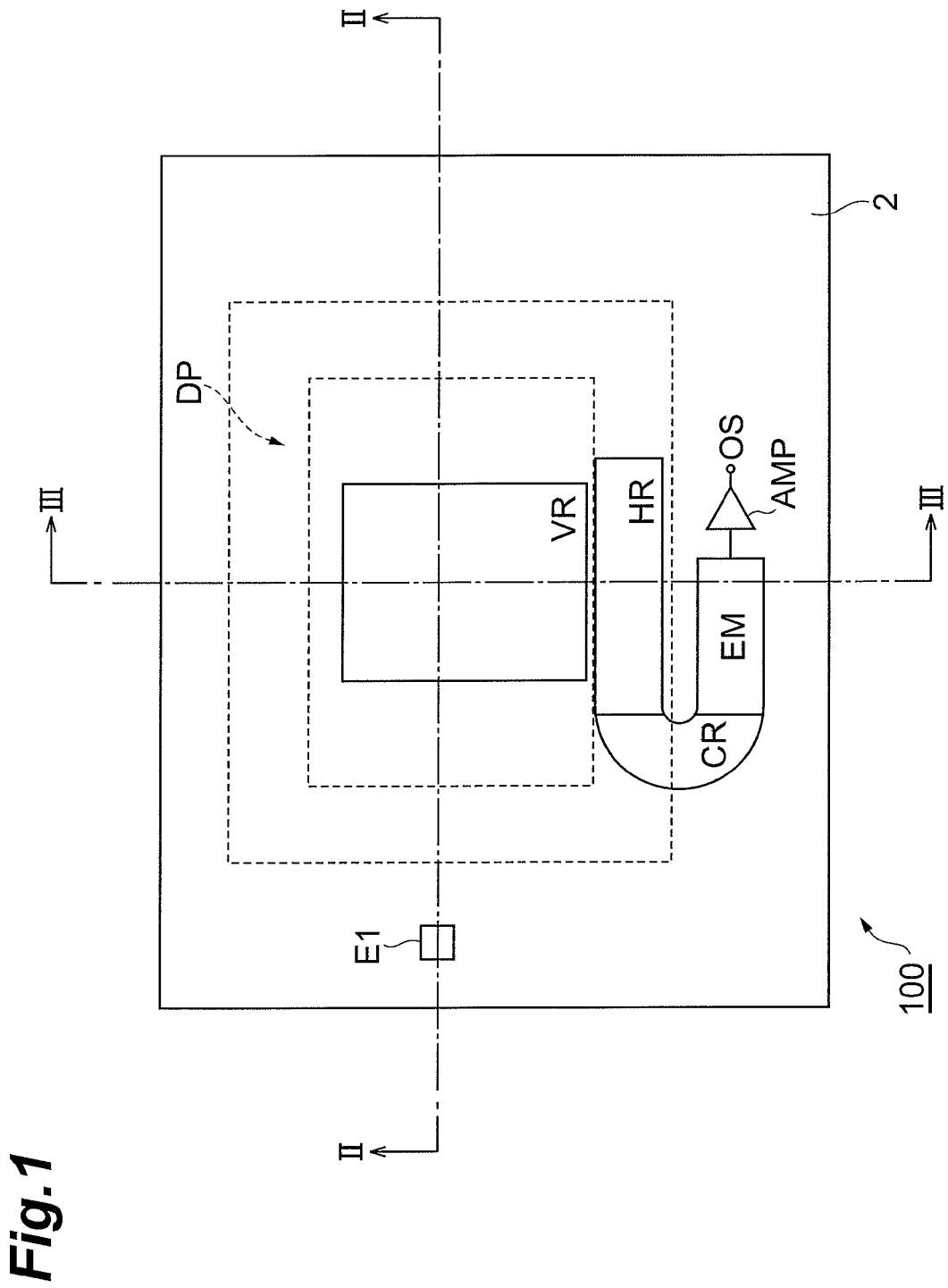
FIG. 1 is a plan view of a solid state imaging device.

Exemplary embodiments of a solid state imaging device with an electron multiplying function are explained below. Like reference numerals are used for like structural elements and overlapping explanation is omitted.

FIG. 1 is a plan view of a back-surface illuminated solid state imaging device 100.

An insulating layer 2 is formed on a semiconductor substrate, and a plurality of vertical electric charge transfer electrodes is formed on the surface of the insulating layer 2. These transfer electrodes form a vertical shift register. The region in which the vertical register is formed is an imaging region VR. In the present embodiment, the imaging region VR is a CCD imaging region. It is permissible to form the imaging region VR with a MOS imaging sensor.

A horizontal shift register HR is arranged along one side of the imaging region VR. A corner register CR is arranged in an electric charge transfer path between the horizontal shift register HR and a multiplication register EM. The structure of the corner register CR is the same as that of the horizontal shift register HR except that its electric charge transfer direction is bent into an arc-shape. An amplifier AMP is electrically connected to an output terminal of the multiplication register EM. An image signal obtained at an output terminal OS of the amplifier AMP is read sequentially pixel by pixel.

A backside of the semiconductor substrate on which the insulating layer 2 is formed is etched in a rectangular shape to form a recessed portion DP. The side on which the recessed portion DP is formed is the backside of the substrate, and an image is incident on a backside of the solid state imaging device.

Figure 2:
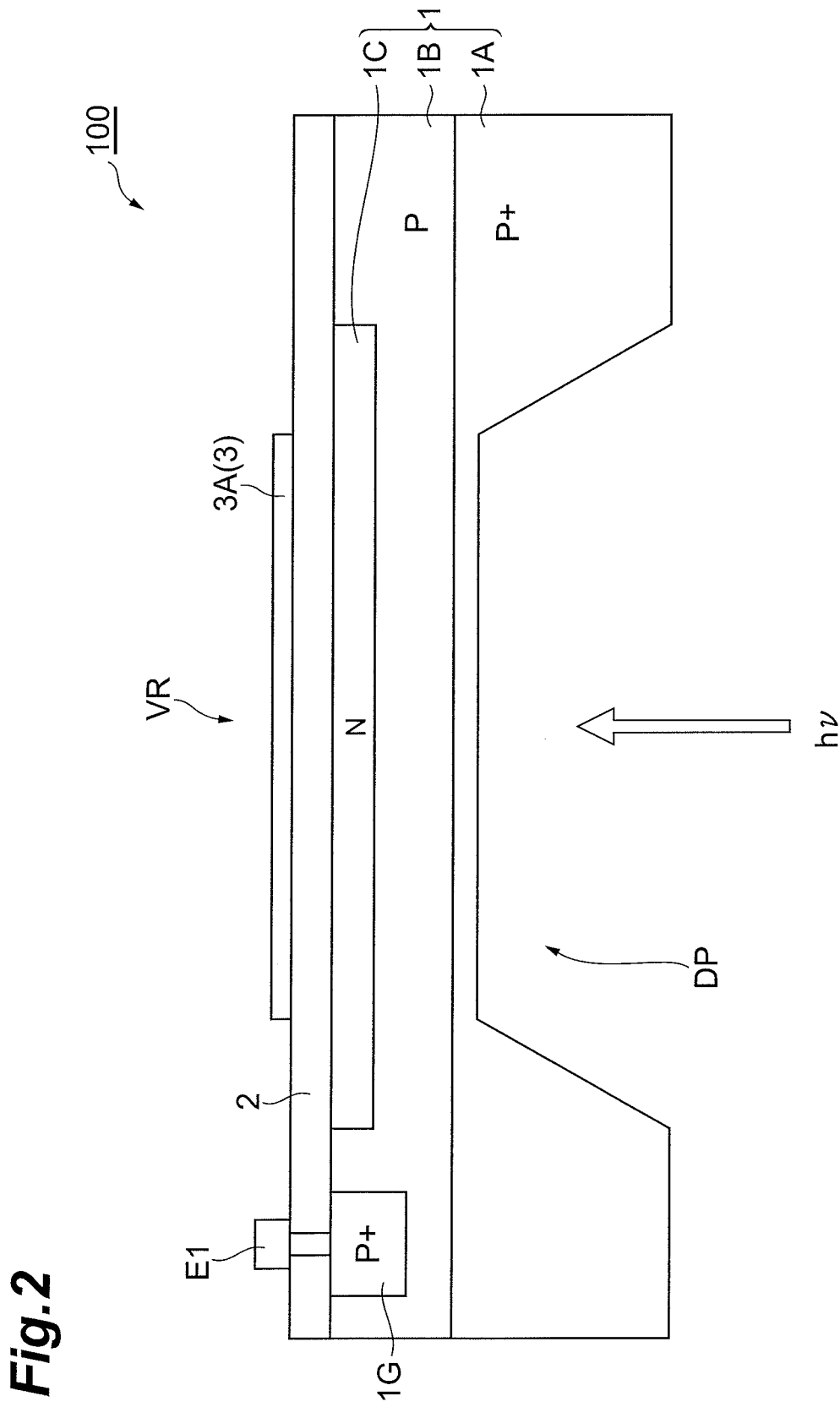
FIG. 2 is a sectional view of the solid state imaging device shown in FIG. 1 along arrows II-II.

FIG. 2 is a sectional view of the solid state imaging device shown in FIG. 1 along arrows II-II.

The solid state imaging device 100 includes a P-type semiconductor substrate 1A, a P-type epitaxial layer 1B grown on the semiconductor substrate 1A, the imaging region VR grown within the epitaxial layer 1B, and an N-type semiconductor region 1C grown within the epitaxial layer 1B. Thus, the solid state imaging device 100 has a structure of an embedded channel-type CCD. An optical image hv is incident from the backside of the substrate. The semiconductor substrate 1A is etched from the backside to form the recessed portion DP. An entire structure including all of the semiconductor substrate 1A, the epitaxial layer 1B, and the semiconductor region 1C is taken as the semiconductor substrate 1. The insulating layer 2 is formed on the semiconductor substrate 1, and transfer electrodes 3 are arranged on the insulating layer 2. A P-type contact region 1G is formed within a portion of the epitaxial layer 1B, and an electrode E1 is arranged within the contact region 1G. Electric potentials of the P-type semiconductor substrate 1A and the epitaxial layer 1B are determined when a reference electric potential such as a ground electric potential is applied to the electrode E1.

Electrons are transferred in the imaging region VR in a direction normal to a plan of the paper on which FIG. 2 is printed. Isolations IS (see FIG. 4) constituting a plurality of P-type semiconductor regions that extend in an electric charge transfer direction are formed within the N-type semiconductor region. These isolations form channels of the vertical shift register; however, to simplify the explanation, the isolations have not been shown in the figure.

Figure 3:
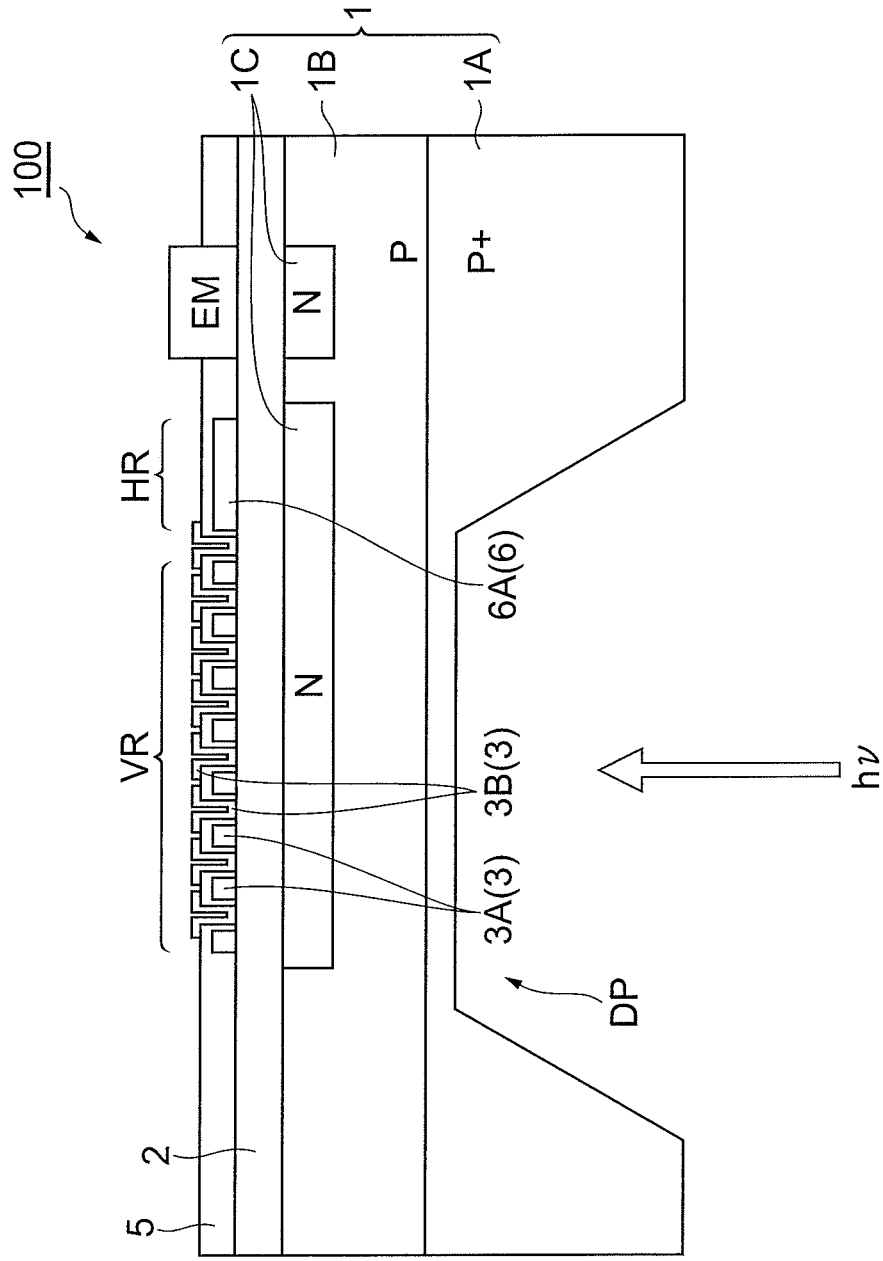
FIG. 3 is a sectional view of the solid state imaging device shown in FIG. 1 along arrows III-III.

FIG. 3 is a sectional view of the solid state imaging device shown in FIG. 1 along arrows III-III.

Transfer electrodes 3A and 3B formed in the imaging region VR are arranged in an alternating manner. Although a portion of these transfer electrodes 3A and 3B is overlapping, an insulating layer 5 is arranged between the adjacent transfer electrodes 3A and 3B. Thus, the transfer electrodes 3A and 3B are electrically separated from each other. A signal output from the imaging region VR is transferred to the multiplication register EM by the horizontal shift registers HR via the corner register CR. Moreover, the multiplication register EM is positioned adjacent to the horizontal shift register HR (only an electrode group is schematically shown as the EM).

The semiconductor substrate 1 has a thin part where the recessed portion DP is formed and a thick part around the thin part. Carriers generated in the thick part because of incident light annihilate before they reach the surface. Particularly, because a P-type impurity concentration in the semiconductor substrate 1 is substantially higher than a P-type impurity concentration in the epitaxial layer 1B, traveling distances of the carriers are also shorter. Each of the horizontal shift register HR, the corner register CR (see FIG. 1), and the multiplication register EM are formed at least in a region that is outside of the thin part, and they are preferably formed in the thick part. Therefore, the carriers generated in the thick part do not mix inside these registers.

Figure 4:
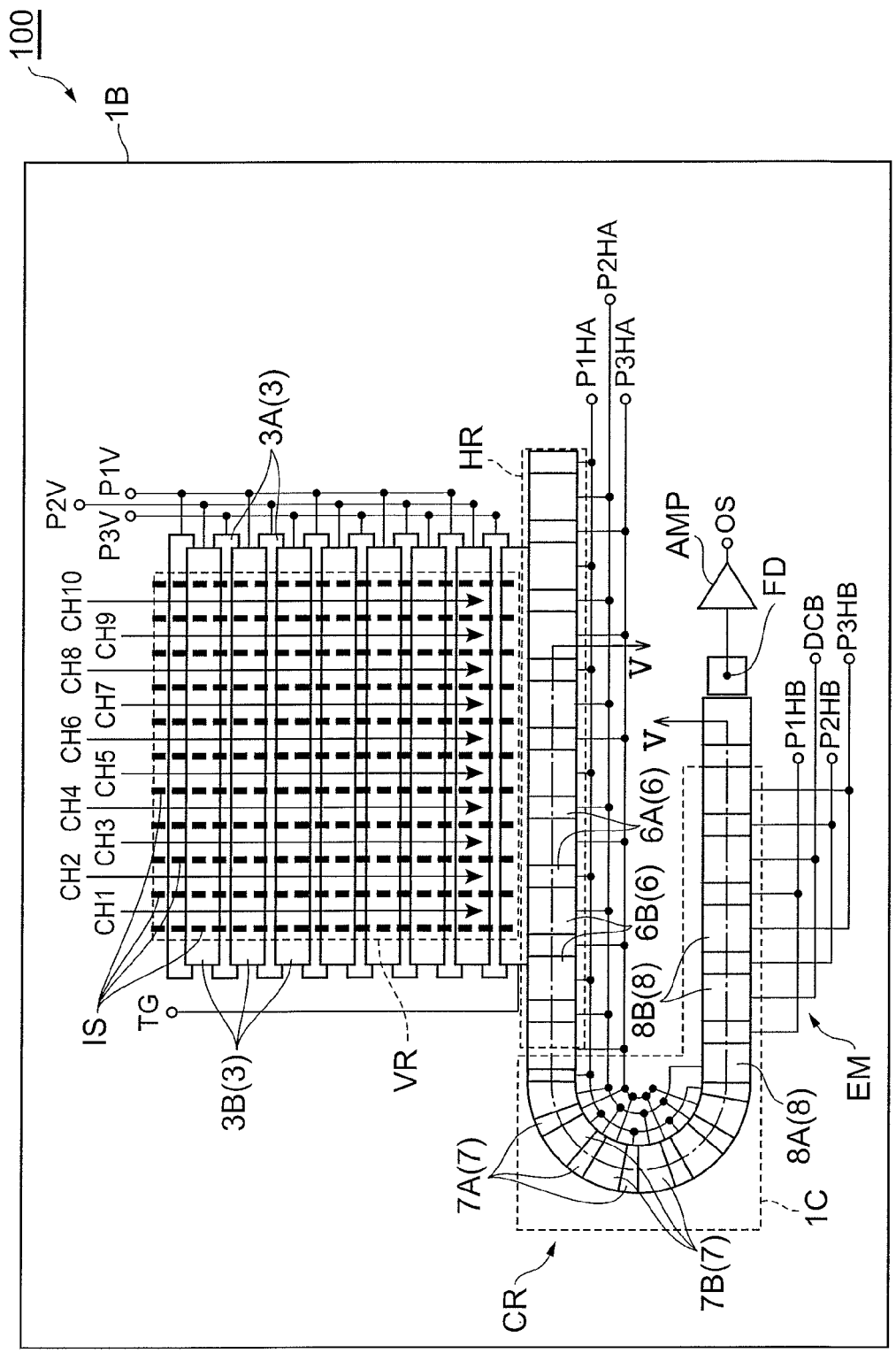
FIG. 4 is a plan, view illustrating a detailed connection relation of the solid state imaging device.

FIG. 4 is a plan view illustrating a detailed connection relation of the solid state imaging device.

The imaging region VR includes the vertical transfer electrodes 3A and 3B that are arranged alternately in a vertical direction. Each of the transfer electrodes 3A and 3B extends in a horizontal direction, and adjacent transfer electrodes 3A and 313 have a slight overlap. In the present embodiment, a 3-phase driving voltage (P1V, P2V, and P3V) is applied to the transfer electrodes 3. Electrons that accumulate right below the transfer electrodes 3 are transferred in the vertical direction because of the application of the driving voltage to the transfer electrodes 3. A CCD of an FFT (Full Frame Transfer) scheme is shown in this figure. However, this CCD can be replaced with a CCD of an FT (Frame Transfer) scheme that further includes an accumulation region, or with a CCD of an IT (Interline Transfer) scheme.

The P-type isolations IS for separating each of vertical electric charge transfer channels CH1 to CH10 are formed in the imaging region VR. An electric charge generated in response to incidence of light in the channels CH1 to CH10 that constitute the imaging region VR is transferred in the vertical direction. The electric charge of each channel flows right below each of transfer electrodes 6 of the horizontal shift register HR.

A transfer electrode (transfer gate) to which a gate voltage TG is applied is provided between the imaging region VR and the horizontal shift register HR. An amount of electric charge that can flow in the horizontal shift register HR from the imaging region VR can be controlled by controlling the gate voltage TG.

The transfer electrodes 6A and 613 that constitute the horizontal shift register HR are arranged alternately in the horizontal direction. The transfer electrodes 6A and 6B have an overlapping portion. In any of the registers, the insulating layer 5 (see FIG. 5) that is formed on the insulating layer 2 is positioned between adjacent transfer electrodes 3A, 3B, 6A, 6B, 7A, 7B, 8A, and 8B. Thus, the adjacent transfer electrodes are electrically separated from each other. A 3-phase driving voltage (P1HA, P2HA, and P3HA) is applied to the transfer electrodes 6. Electrons right below the transfer electrodes 6 are transferred in the horizontal direction. The corner register CR that is bent in an arc-shape continues with the horizontal shift register HR. The transfer electrodes 7A and 7B that constitute the corner register CR are arranged alternately along the arc. The transfer electrodes 7A and 713 have an overlapping portion. The 3-phase driving voltage (P1HA, P2HA, and P3HA), which is the same as the driving voltage applied to the horizontal shift register HR, is applied to the transfer electrodes 7. Electrons right below the transfer electrodes 7 are transferred along the arc to the multiplication register EM.

In the multiplication register EM, the transfer electrodes 8A and 8B are arranged alternately in the horizontal direction. The transfer electrodes 8A and 8B have an overlapping portion. A 3-phase driving voltage (P1HB, P2HB, and P3HB) is applied to the transfer electrodes 8. Electrons right below the transfer electrodes 8 are transferred in the horizontal direction. Among four sets of the transfer electrodes 8, the driving voltage is applied to three sets of the transfer electrodes 8, and a direct-current electric potential DCB is applied to the remaining one set of the transfer electrodes 8 that are DC electrodes. In the present embodiment, when there are four sets of the transfer electrodes 8 that are arranged adjacent to each other in the horizontal direction, that is, when there are a first, second, third, and fourth sets of the transfer electrodes 8, the set of transfer electrodes that is positioned second is taken as the DC electrodes and the direct-current electric potential DCB is applied to this set of transfer electrodes.

A positive electric potential is applied to the transfer electrodes 8. An appropriate positive electric potential (P1HB) is applied to the first set of the transfer electrodes 8 thereby making a potential well deep (increase the electric potential: see FIG. 7) to accumulate electrons in this well. A high positive electric potential (a maximum value of P2HB>a maximum value of P2HA) is applied to the third set of the transfer electrodes 8 thereby making a potential well deep. A certain electric potential (DCB) applied to the second set of the transfer electrodes 8 is lower than these electric potentials (P1HB and P2HB). Thus, a potential barrier is formed between the first set and the third set of the transfer electrodes 8. In this state, when the potential well of the first set of the transfer electrodes 8 is made shallower (decrease electric potential: see FIG. 7), electrons overflow from this potential well, cross the bather, and fall in the potential well (depth of potential well=ΦA) of the third set of the transfer electrodes 8. Electron multiplication is performed when the electrons fall. Subsequently, the potential of the first set of the transfer electrodes 8 is further decreased (upward direction) so that the accumulated electrons are completely transferred to the potential well of the third set of the transfer electrodes 8. The direction of the potential Φ is positive downward.

Then, by making the potential well right below the fourth set of the transfer electrodes 8 deeper and the potential well right below the third set of the transfer electrodes 8 shallower, the multiplied electrons can be moved in the potential well of the fourth set of the transfer electrodes 8. Similarly, by employing the same method that is used to perform the electric charge transfer from the third set of the transfer electrodes 8 to the fourth set of the transfer electrodes 8, the electrons that have accumulated in the potential well of the fourth set of the transfer electrodes 8 can be moved to the next set of the transfer electrodes 8, i.e., the first set of the transfer electrodes 8, and accumulated there. Thereafter, multiplication and transfer steps are repeated for the next set in the same manner as described above. Although a 3-phase driving is used in the present embodiment to perform electric charge transfer, it is possible to use a 4-phase driving or a 2-phase driving.

The multiplied electrons finally flow in a high impurity concentration N-type semiconductor region FD. The N-type semiconductor region FD is connected to the amplifier AMP. The amplifier AMP is a floating diffusion amplifier formed within the semiconductor substrate 1.

Figure 5:
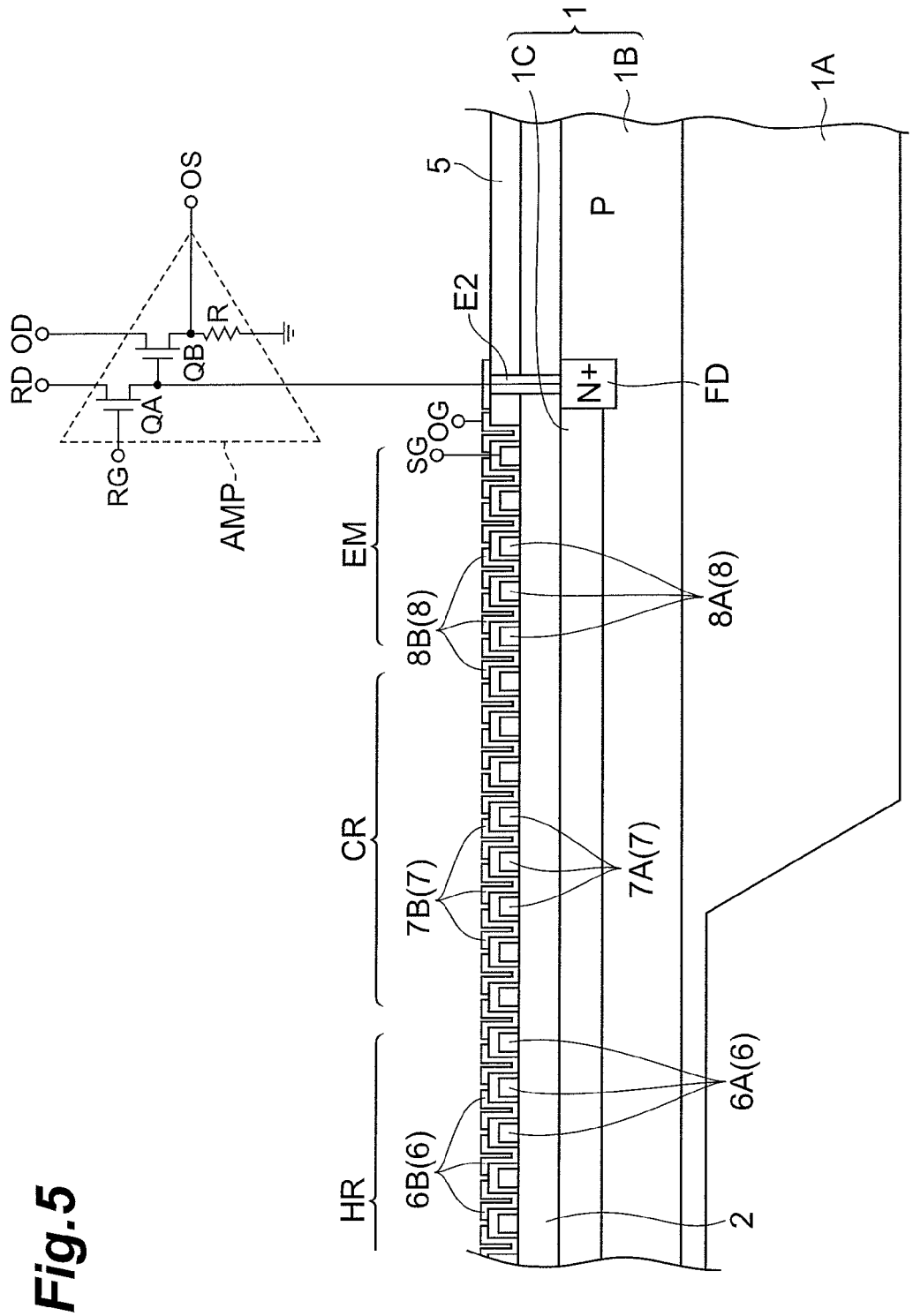
FIG. 5 is a sectional view of the solid state imaging device shown in FIG. 4 along arrows V-V.
Figure 6:
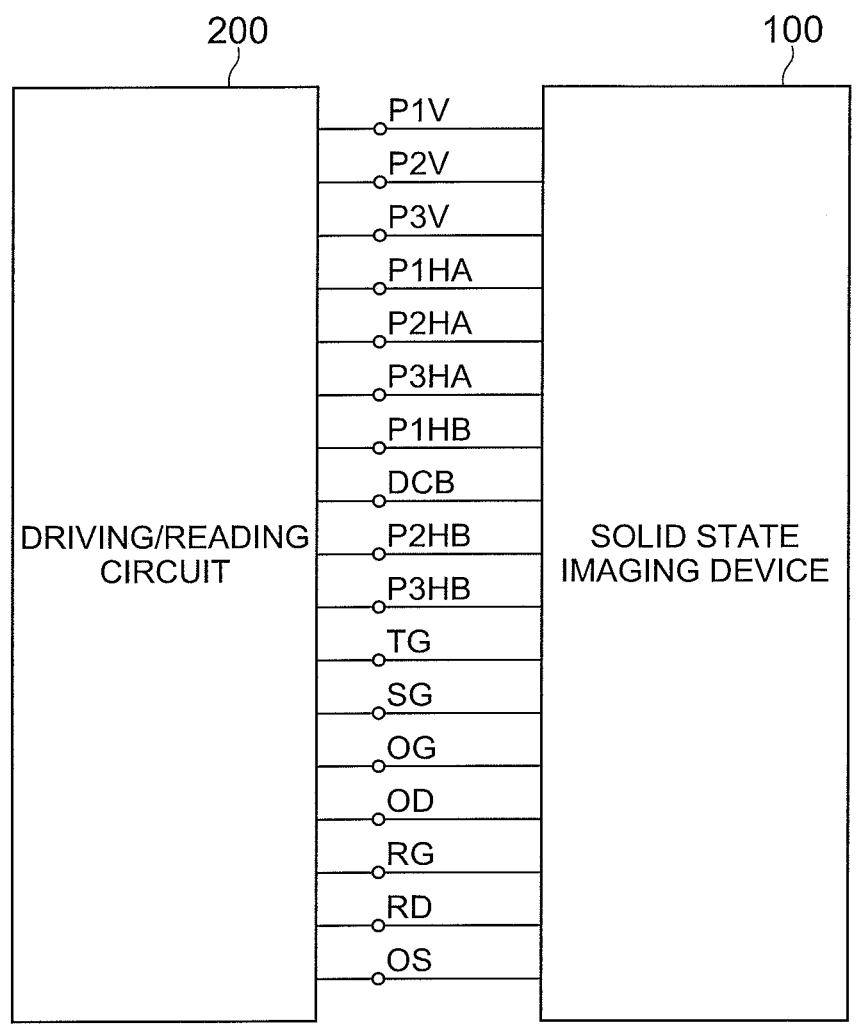
FIG. 6 is a block diagram illustrating a connection relation between a driving/reading circuit and the solid state imaging device.

FIG. 5 is a sectional view of the solid state imaging device shown in FIG. 4 along arrows V-V. FIG. 6 is a block diagram illustrating a connection relation between a driving/reading circuit 200 and the solid state imaging device 100. Various signals are supplied from the driving/reading circuit 200 to the solid state imaging device 100. To make the explanation of an electric charge reading unit simple, identical symbols are used for structural elements and signals.

A configuration of a signal reading unit is explained first. The amplifier AMP is connected to the semiconductor region FD of the signal reading unit. A gate electric potential of a transistor QB varies depending on an amount of electric charge in the semiconductor region FD, and in response to this, an amount of electric current flowing from an output drain OD through a resistor R via the transistor QB also varies. That is, a voltage OS (output voltage) between two terminals of the resistor R varies depending on the amount of electric charge accumulated in the semiconductor region FD, and this voltage OS is read.

A reset voltage RG is input to a reset gate RG after completion of reading of an electric charge from one pixel. Thus, the electric potential of the semiconductor region FD is reset via the reset drain RD. Because a potential of the reset drain RD is positive, in a reset operation, a potential well in which electrons can be accumulated is formed in the semiconductor region FD. After completion of the reset operation, the electric potential of the semiconductor region FD is set to a floating level by controlling the reset gate RG and turning off a transistor QA.

Before causing the electric charge to flow in the semiconductor region FD, an electric potential of a previous signal gate SG is increased to cause the electrons to accumulate there, and an electric potential of an output gate OG is fixed to form a barrier so that the electric charge does not flow from a region right below the signal gate SG to the semiconductor region FD. Thereafter, in the state that the electric potential of the output gate OG is fixed, when the electric potential of the signal gate SG is decreased, the electric charge accumulated right below the signal gate SG flows to the semiconductor region FD.

The multiplication register EM is explained next. The multiplication register EM functions to multiply electrons from the horizontal shift register HR.

The epitaxial layer is known for its excellent crystalline property. Therefore, when the N-type semiconductor region 1C is formed within the P-type epitaxial layer 1B, electron transfer is performed with a high accuracy because the electrons in each of the vertical shift register, the horizontal shift register HR, and the corner register CR are transferred within a semiconductor having an excellent crystalline property. The electrons transferred in this manner enter the semiconductor region 1C of the multiplication register EM.

The multiplication register EM includes the N-type semiconductor region 1C, the insulating layer 2 formed on the semiconductor region 1C, a plurality of the transfer electrodes 8 formed adjacent to each other on the insulating layer 2, and the DC electrode 8 that is located between the transfer electrodes 8 and to which the direct current electric potential DCB (see FIGS. 4 and 7) is applied. The epitaxial layer 1B is formed on the entire substrate. On the other hand, the N-type semiconductor region 1C is selectively formed only in the region in which are formed the semiconductor region 1C, the imaging region VR, the horizontal shift register HR, the corner register CR, and the multiplication register EM.

Figure 7:
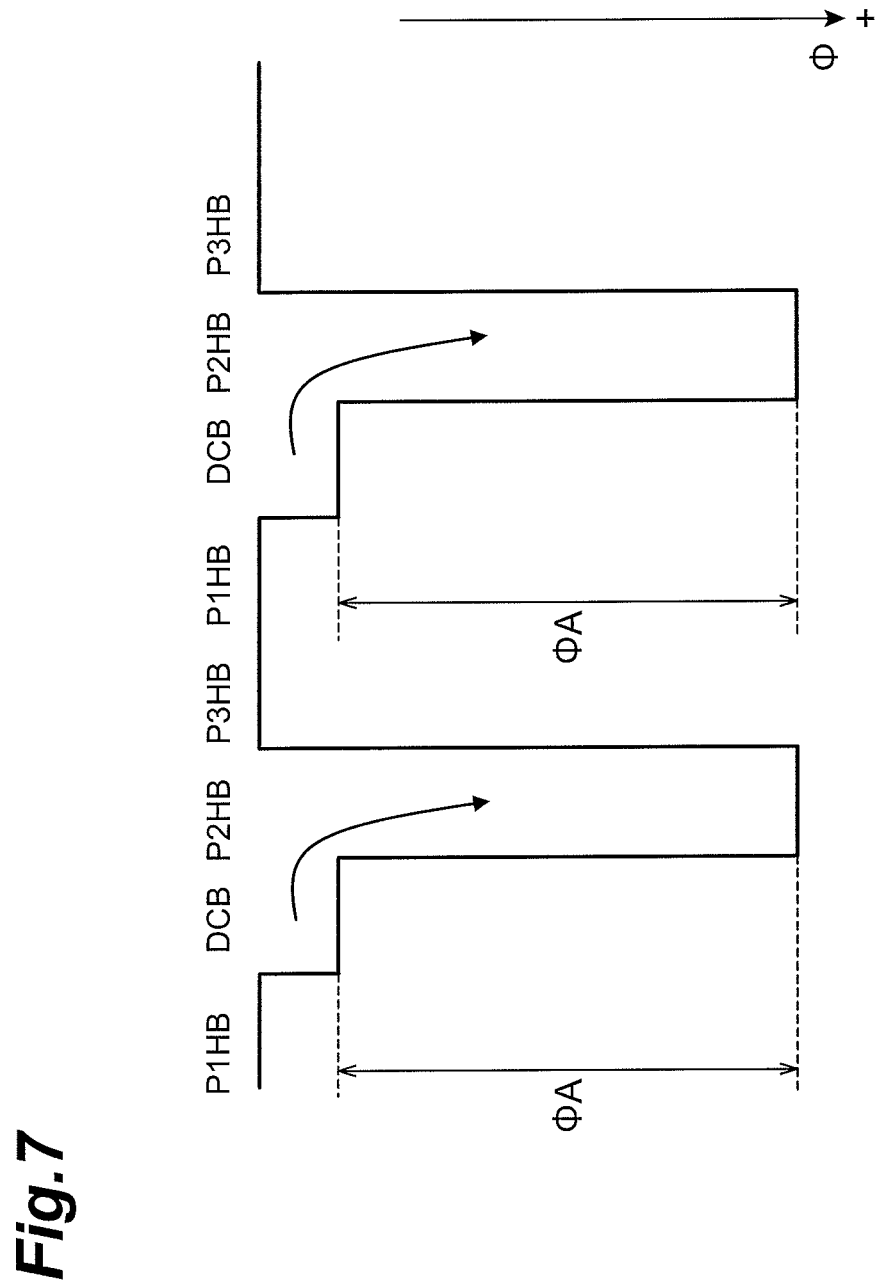
FIG. 7 is a potential diagram of a multiplication register.

FIG. 7 is a potential diagram of a multiplication register EM.

In the above structure, as shown in this figure, the degree of electron multiplication increases significantly because there takes place a precipitous electric potential change right below the transfer electrodes 8 of the multiplication register EM. In other words, because a precipitous electric potential change takes place in the N-type semiconductor region 1C between the DC electrodes 8 to which the direct-current electric potential DCB is applied and next-stage transfer electrodes (multiplication electrodes) 8 to which the electric potential P2HB is applied, excellent electron multiplication is performed.

Electron multiplication is performed when the electrons flow from the potential well (electric potential P1HB) of the first set of the transfer electrodes to the potential well (electric potential PH2B) of the third set of the transfer electrodes after crossing the potential well of the second set of the transfer electrodes to which the direct-current electric potential DCB is applied.

Figure 8:
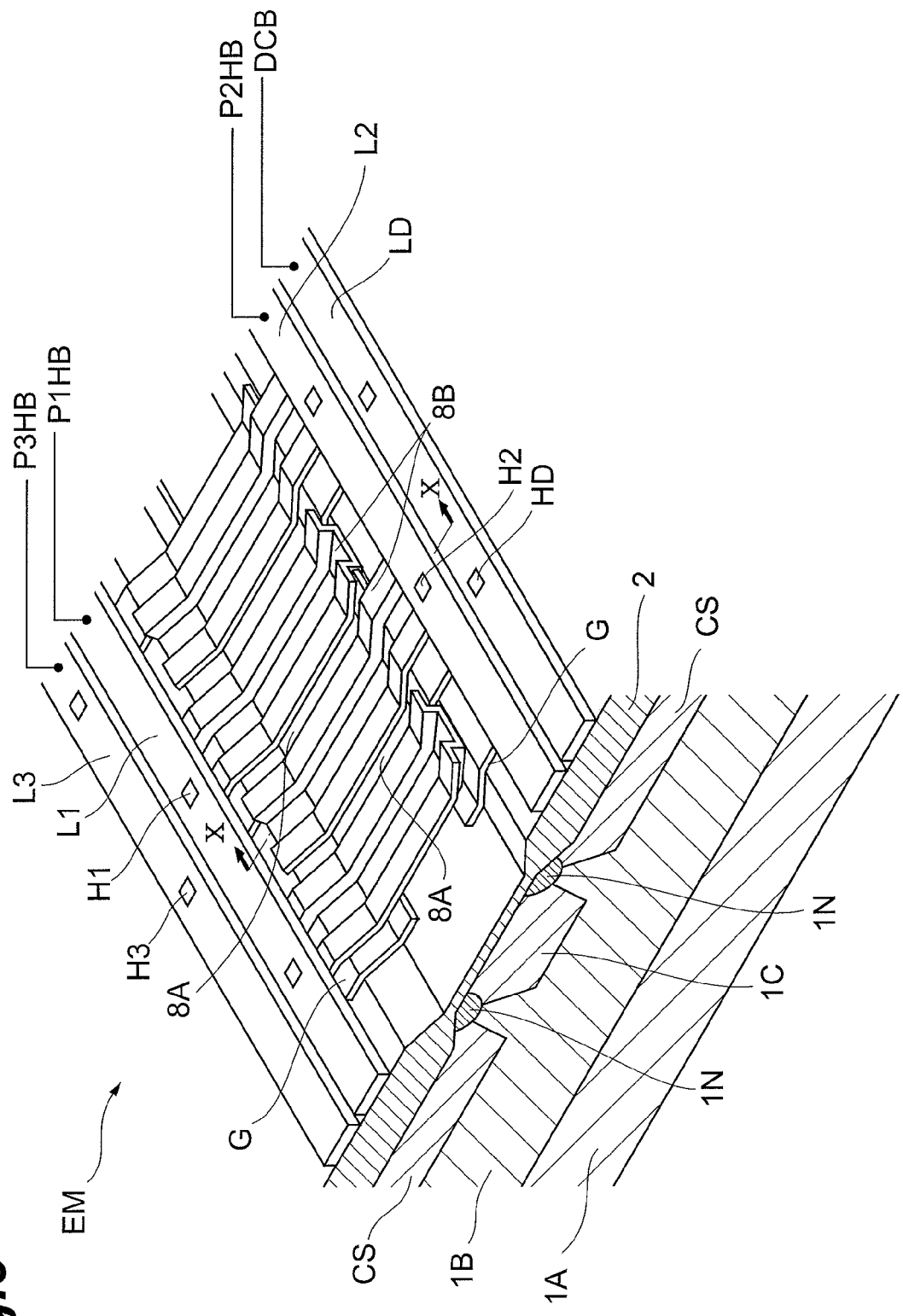
FIG. 8 is a perspective view of a multiplication register according to the first embodiment.
Figure 9:
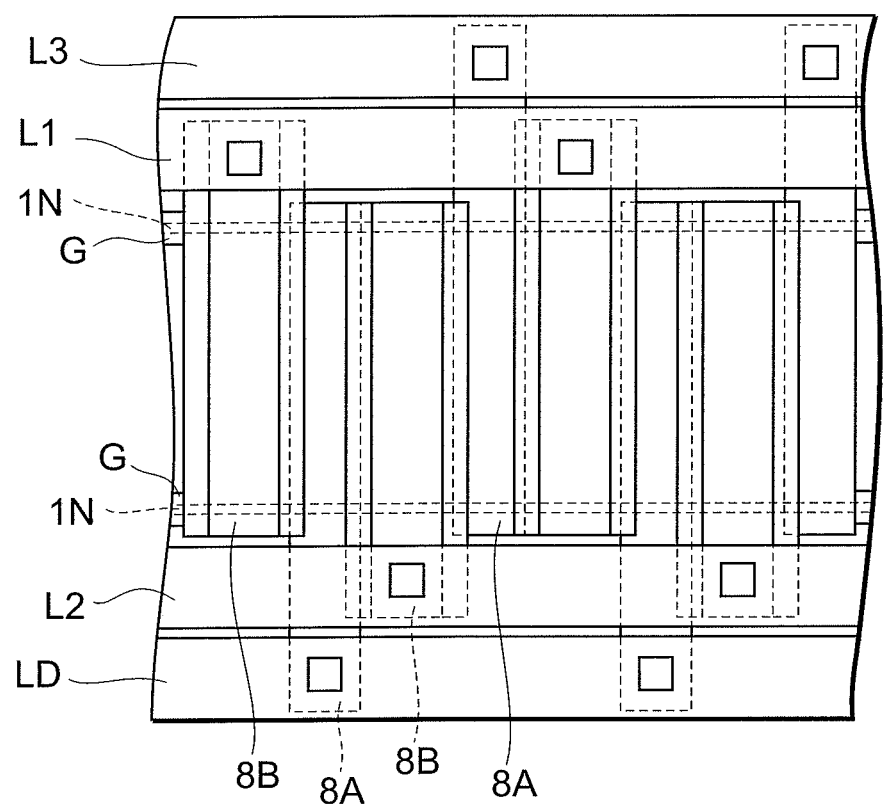
FIG. 9 is a plan view of the multiplication register.
Figure 10:
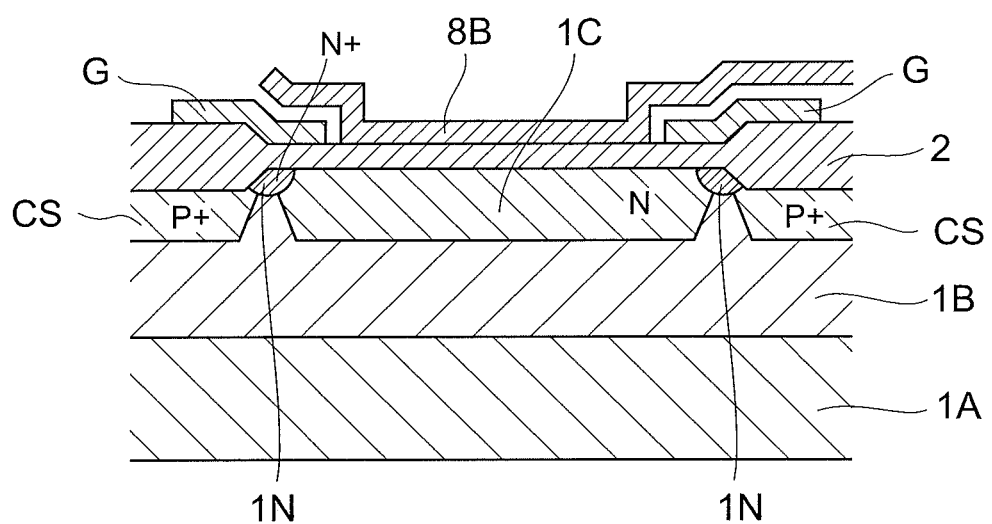
FIG. 10 is a sectional view of the multiplication register shown in FIG. 8 along arrows X-X.

FIG. 8 is a perspective view of the multiplication register EM according to a first embodiment, FIG. 9 is a plan view of the multiplication register, and FIG. 10 is a sectional view of the multiplication register EM shown in FIG. 8 along arrows X-X.

As described above, the solid state imaging device with the electron multiplying function includes the imaging region VR, the horizontal shift register HR that transfers the electrons from the imaging region VR, and the multiplication register EM that multiplies the electrons from the horizontal shift register HR. The multiplication register EM includes the N-type semiconductor region 1C, the insulating layer 2 formed on the semiconductor region 1C, a plurality of the transfer electrodes 8 formed adjacent to each other on the insulating layer 2, and the DC electrodes 8 (electrodes to which DCB is applied) that are located between the transfer electrodes 8 and to which the direct current electric potential is applied. The transfer electrodes positioned at a next stage of the DC electrodes 8 (DCB) are taken as the multiplication electrodes 8 (P2HB). Although a portion of the adjacent electrodes 8 is overlapping, an insulating layer is arranged between them. Thus, the adjacent electrodes 8 are electrically separated from each other.

In a sectional view (see FIG. 10) normal to an electron transfer direction of the multiplication register EM, the insulating layer 2 is thicker at both side portions than in a central region, and a pair of overflow drains 1N is formed at a boundary between the central region and both the side portions of the semiconductor region 1C. The insulating layer 2 on both the side portions is a local oxidizing film (LOCOS). Moreover, each of the overflow drains 1N extend along the electron transfer direction (a direction normal to both a longitudinal direction and a thickness direction of each transfer electrode 8) of the multiplication register EM. Because the insulating layer 2 is thin in the central region, the semiconductor region 1C can be formed by performing ion implantation or diffusion of impurities via the insulating layer 2. However, the impurities can be added before forming the insulating layer 2 in the central region.

Each of the overflow drains 1N touches a pair of the boundaries in the insulating layer 2. Isolations (channel stops) CS made up of high impurity concentration P-type semiconductors are formed right below the thick portions of the insulating layer 2. The isolations CS extend along the electron transfer direction. An impurity concentration in the isolations CS is higher than the impurity concentration in the epitaxial layer 1B. Each of the overflow drains 1N is formed between the P-type isolations CS and the N-type semiconductor region 1C.

The electrodes 8 (8A and 8B) to which drive signals P1HB, DCB, P2HB, and P3HB are applied, respectively, are electrically connected to wirings L1, LD, L2, and L3 via contact electrodes H1, HD, H2, and H3, respectively. Therefore, if the drive signals P1HB, DCB, P2HB, and P3HB are applied, respectively, to the wirings L1, LD, L2, and L3, a desired bias potential can be applied to each of the electrodes 8. The wirings L1, LD, L2, and L3 extend along the electron transfer direction, and are arranged on the thick portion of the insulating layer 2, and above the electrodes.

In the multiplication register EM, with respect to a potential of the semiconductor region right below the DC electrodes 8 (the electrodes to which DCB is applied), a high voltage is applied to a certain transfer electrode (multiplication electrode) 8 (the electrode to which P2HB is applied), electron multiplication is performed by making deeper the potential of the semiconductor region right below the transfer electrode 8.

The insulating layer 2 is thick at both side portions of electron transition and it is formed such that it pushes down a semiconductor surface inwards. Therefore, the thick portion of the insulating layer 2, in cooperation with the isolations CS, functions to limit an electron transition region right below the central region (thin region) of the insulating layer 2. Moreover, the thick portions of the insulating layer 2 function as masks at the time of adding N-type impurities, and are also useful in controlling an impurity addition region.

Due to an electric field generated by the multiplication electrodes 8 to which a high voltage is applied, a spurious electric charge is generated at the boundary (bird's beak) between a place where the insulating layer 2 is thick (both side portions) and a place where the insulating layer 2 is thin (central region), or inside the semiconductor regions 1C and CS right below the insulating layer 2 outside the boundary. A pair of the overflow drains 1N is formed at the boundary. Because each of the overflow drains 1N extends along the electron transfer direction of the multiplication register EM, the overflow drains 1N can absorb the generated spurious electric charge. Thus, electron multiplication with less noise can be performed in the multiplication register EM.

The multiplication register EM in this embodiment further includes overflow gate electrodes G. The overflow gate electrodes G are insulated from the multiplication electrodes 8 and the overflow drains 1N, and are disposed between the multiplication electrodes 8 and the overflow drains 1N. To explain in detail, the overflow gate electrodes G extend from the thin portion to the thick portion of the insulating layer 2. Moreover, the overflow gate electrodes G are disposed between both ends of each of the transfer electrodes 8 (8A and 8B) in the longitudinal direction and the insulating layer 2, and they function as shield electrodes for each transfer electrode 8 (8A and 8B). A not shown insulating layer is disposed between the overflow gate electrodes G and all the electrodes 8 (8A and 8B). Moreover, a pair of the overflow gate electrodes G extends along the electron transfer direction. Because excess electrons inside the multiplication register 8 cause a phenomenon similar to blooming, producing noise, the excess electrons are undesirable.

In the present embodiment, by controlling the bias potential applied to the overflow gate electrodes G, the excess electrons present inside the multiplication register EM can be directed into the overflow drains 1N. When a potential that is positive with respect to the potential applied to the overflow drains is applied to the overflow gate electrodes G, a potential barrier below the overflow gate electrodes G becomes low, thereby making the excess electrons to influx easily to the overflow drains 1N. Moreover, a noise charge generated in a region right below the thick portion of the insulating layer 2 that is positioned outside the overflow drains 1N can easily overcome the potential barrier that has become low due to the positive electric potential applied to the overflow gate electrodes G. When the noise charge is discharged inside the overflow drains 1N, influx to the electron transition region (central region) of the multiplication register EM can be suppressed. Due to this, electron multiplication with less noise can be performed.

On the other hand, in the electron transfer, when a potential that is negative with respect to the potential applied to the overflow drains is applied to the overflow gate electrodes G, the potential barrier below the overflow gate electrodes G becomes high, and the electrons in the electron transition region do not influx to the overflow drains 1N. In addition, an influx of an unnecessary electric charge from the isolations CS to the electron transition region can be suppressed. This approach can be employed when transferring an electric charge that has a magnitude less than a threshold value. In other words, by applying the potential that is positive with respect to the potential applied to the overflow drains to the overflow gate electrodes G only when necessary, the excess electrons or the noise charge can be discharged to the overflow drains 1N.

Figure 11:
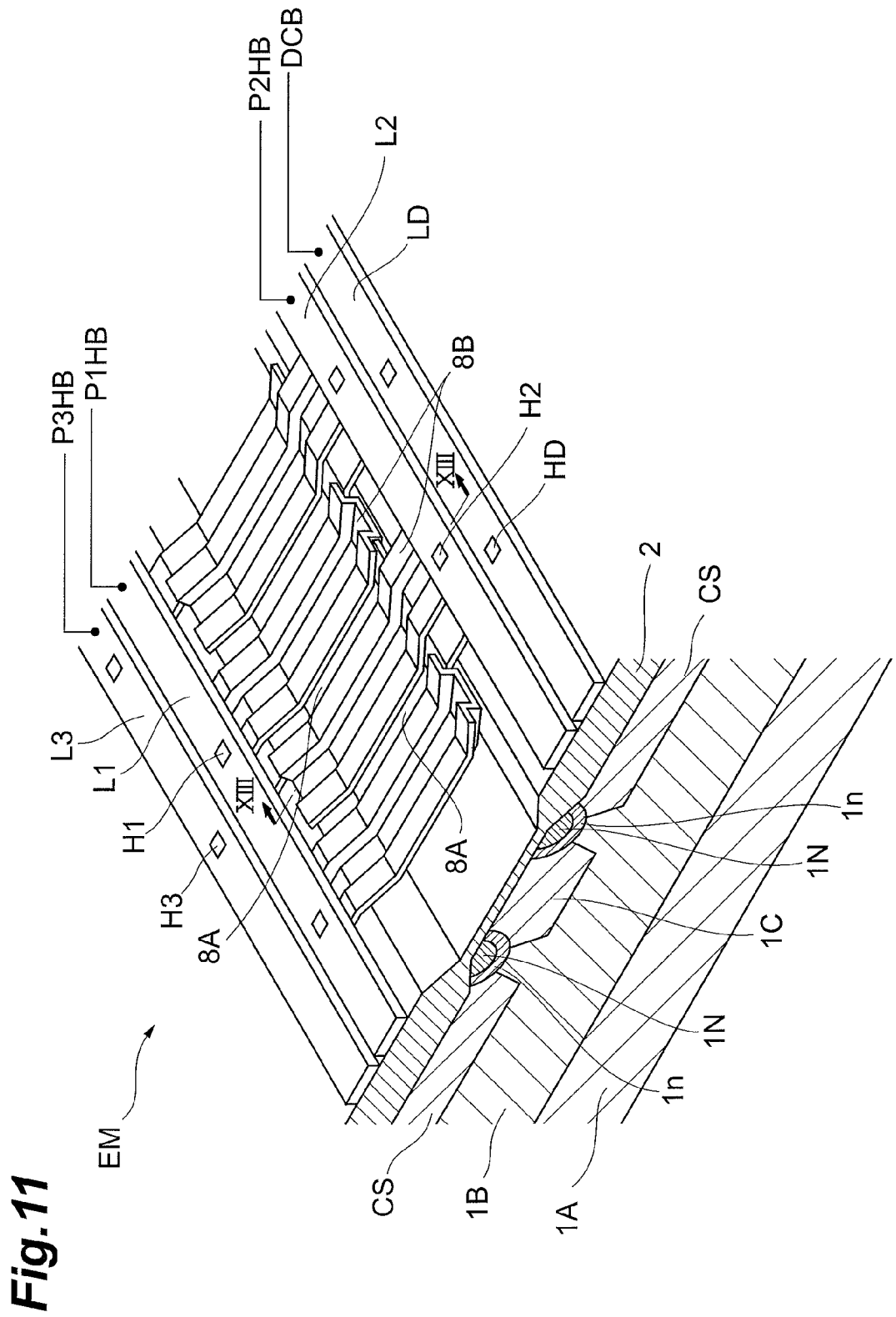
FIG. 11 is a perspective view of a multiplication register according to a second embodiment.
Figure 12:
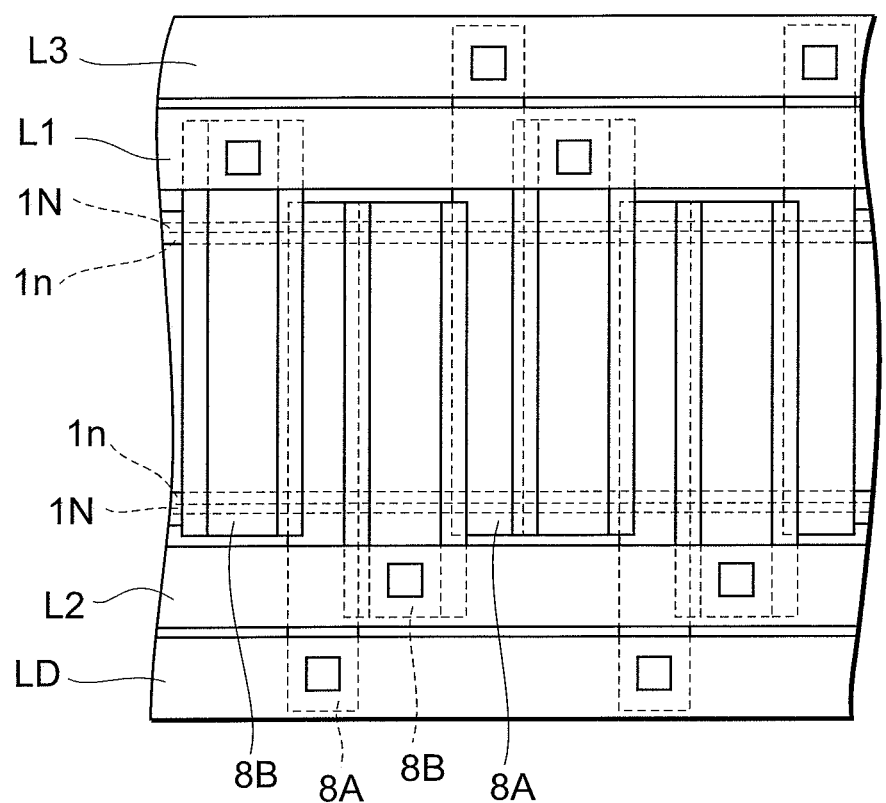
FIG. 12 is a plan view of the multiplication register.
Figure 13:
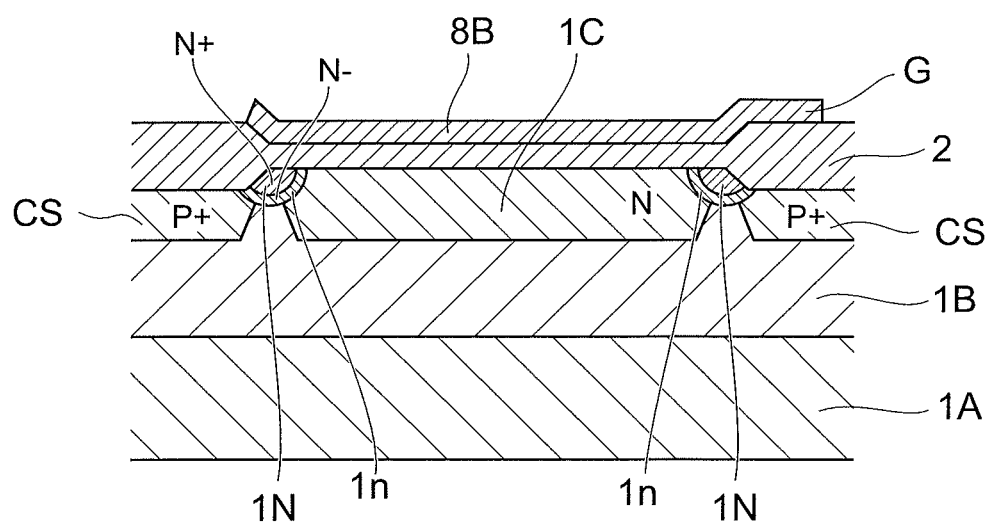
FIG. 13 is a sectional view of the multiplication register shown in FIG. 11 along arrows XIII-XIII.

FIG. 11 is a perspective view of the multiplication register EM according to a second embodiment, FIG. 12 is a plan view of the multiplication register EM, and FIG. 13 is a sectional view of the multiplication register EM shown in FIG. 11 along arrows XIII-XIII. As compared to the first embodiment, the multiplication register EM according to the second embodiment does not include the overflow gate G and a potential barrier region 1$n$ is formed around each overflow drain 1N. The other structure is similar to that of the first embodiment.

The potential barrier regions 1$n$ are disposed between the overflow drains 1N and the semiconductor regions 1C, 1B, and CS, and they obstruct the influx of the electrons from the semiconductor regions 1C, 1B, and CS to the overflow drains 1N. The semiconductor region 1C is made up of an N-type semiconductor 1C. However, the potential barrier regions 1$n$ are made up of an N-type semiconductor having an impurity concentration lower than the semiconductor region 1C, and the overflow drains 1N are made up of an N-type semiconductor having an impurity concentration higher than the semiconductor region 1C. In this case, in view of a comparatively high impurity concentration N-type semiconductor 1C, the low impurity concentration N-type semiconductor functions as a potential barrier for the electrons. In other words, due to the potential barrier, the electrons in the electron transition region do not flow to the overflow drains 1N.

In this structure, even if the overflow gates are not formed, excess electrons that have crossed the potential barrier regions 1$n$ can be flowed from the electron transition region to the overflow drains 1N. When the overflow gates are not formed, the manufacturing process becomes easier. Moreover, the electric charge generated at the boundary becomes less likely to flow to the electron transition region due to the barrier. Due to this, electron multiplication with less noise can be performed. Moreover, the potential barrier regions can suppress an influx of the noise charge, which is generated in the regions right below the thick portions of the insulating layer 2 positioned outside the overflow drains 1N, to the electron transition region of the multiplication register EM. Because of the presence of the N-type semiconductor region 1C, an embedded channel-type CCD has been configured. If the N-type semiconductor region 1C is omitted, a surface channel-type CCD can be configured.

The material of the semiconductor is Si, and an optimum range of an impurity concentration $C_P$ of the P-type semiconductor layer and an impurity concentration $C_N$ of the N-type semiconductor layer in each embodiment is as given below. A surface resistance of the P-type epitaxial layer 1B is set to cause a photosensitivity of the imaging region VR high.

Impurity concentration $C_P(1A)$ of the P-type semiconductor substrate $1A = 1 \times 10^{17}$ to $1 \times 10^{19}/cm^3$ Impurity concentration $C_P(1B)$ of the P-type epitaxial layer $1B = 1 \times 10^{11}$ to $1 \times 10^{16}/cm^3$ Impurity concentration $C_N(1C)$ of the N-type semiconductor region $1C = 1 \times 10^{12}$ to $1 \times 10^{17}/cm^3$ Impurity concentration $C_N(1N)$ of the overflow drain $1N = 1 \times 10^{17}$ to $1 \times 10^{20}/cm^3$ Impurity concentration $C_N(1n)$ of the potential barrier region $1n = 1 \times 10^{11}$ to $1 \times 10^{17}/cm^3$ An impurity concentration C satisfies the following relation:

$$CP(1A) > CN(1C) > CP(1B)$$

A thickness t (1A) of the P-type semiconductor substrate 1A, a thickness t (1B) of the P-type epitaxial layer 1B, and a thickness t (1C) of the N-type semiconductor region 1C satisfy the following relation:

$$t(1A) > t(1B) > t(1C)$$

The above embodiment can be applied, without etching the semiconductor substrate, to a front-surface illuminated solid state imaging device.

INDUSTRIAL APPLICABILITY

The present invention is applicable to the solid state imaging device with the electron multiplying function that enables imaging of a very weak optical image by performing electron multiplication with high performance.

REFERENCE SIGNS LIST

1A ... Semiconductor substrate, 1B ... Epitaxial layer, VR ... Imaging region, 1C ... N-type semiconductor region, HR ... Horizontal shift register, EM ... Multiplication register.

The invention claimed is:

1. A solid state imaging device with an electron multiplying function comprising:
   an imaging region;
   a horizontal shift register that transfers electrons from the imaging region; and
   a multiplication register that multiplies the electrons from the horizontal shift register, wherein
   the multiplication register includes
      a semiconductor region,
      an insulating layer formed on the semiconductor region,
      a plurality of transfer electrodes formed adjacent to each other on the insulating layer; and
      DC electrodes that are arranged between the transfer electrodes and to which a direct-current electric potential is applied, wherein
   in a section normal to an electron transfer direction of the multiplication register, the insulating layer is thicker at both side portions than in a central region, and a pair of overflow drains is formed at a boundary between the central region and both the side portions of the semiconductor region, and
   each of the overflow drains extends along the electron transfer direction of the multiplication register.

2. The solid state imaging device with the electron multiplying function according to claim 1, wherein
   the transfer electrodes positioned at a next stage of the DC electrodes are taken as multiplication electrodes, the solid state imaging device with the electron multiplying function further includes overflow gate electrodes insulated from the multiplication electrodes and the overflow drains and disposed between the multiplication electrodes and the overflow drains.

3. The solid state imaging device with the electron multiplying function according to claim 1, further comprising
   potential barrier regions disposed between the overflow drains and the semiconductor regions and that obstruct an influx of the electrons from the semiconductor regions to the overflow drains.

4. The solid state imaging device with the electron multiplying function according to claim 3, wherein
   the semiconductor region is comprised of an N-type semiconductor,
   the potential barrier regions are comprised of an N-type semiconductor having an impurity concentration lower than the semiconductor region, and
   the overflow drains are comprised of an N-type semiconductor having an impurity concentration higher than the semiconductor region.

* * * * *